(12) United States Patent
Zhang et al.

(10) Patent No.: US 7,978,442 B2
(45) Date of Patent: Jul. 12, 2011

(54) CPP DEVICE WITH A PLURALITY OF METAL OXIDE TEMPLATES IN A CONFINING CURRENT PATH (CCP) SPACER

(75) Inventors: Kunliang Zhang, Milpitas, CA (US); Min Li, Dublin, CA (US); Yue Liu, Fremont, CA (US); Hideaki Fukuzawa, Kawasaki (JP); Hiromi Yuasa, Kawasaki (JP)

(73) Assignees: TDK Corporation, Tokyo (JP); Kabushiki Kaisha Toshiba, Tokyo (JP)

( * ) Notice: Subject to any disclaimer, the term of this patent is extended or adjusted under 35 U.S.C. 154(b) by 929 days.

(21) Appl. No.: 11/906,716

(22) Filed: Oct. 3, 2007

(65) Prior Publication Data

US 2009/0091865 A1   Apr. 9, 2009

(51) Int. Cl.
*G11B 5/39* (2006.01)
(52) U.S. Cl. .................................... 360/324.2
(58) Field of Classification Search ............... 360/324.2, 360/324.1, 324.11, 324.12
See application file for complete search history.

(56) References Cited

U.S. PATENT DOCUMENTS

| 7,072,153 | B2* | 7/2006 | Koui et al. ............... 360/324.1 |
| 7,177,121 | B2 | 2/2007 | Kojima et al. |
| 7,280,323 | B2* | 10/2007 | Sato et al. ............... 360/324.1 |
| 7,453,672 | B2* | 11/2008 | Dieny et al. ............. 360/324.1 |
| 7,495,870 | B2* | 2/2009 | Yuasa et al. ............. 360/324.2 |
| 7,782,575 | B2* | 8/2010 | Tsuchiya et al. ......... 360/324.1 |
| 7,821,748 | B2* | 10/2010 | Fukuzawa et al. ....... 360/324.2 |
| 2003/0053269 | A1 | 3/2003 | Nishiyama |
| 2005/0094317 | A1 | 5/2005 | Funayama |
| 2007/0070556 | A1 | 3/2007 | Zhang et al. |
| 2007/0188936 | A1 | 8/2007 | Zhang et al. |
| 2008/0192388 | A1 | 8/2008 | Zhang et al. |
| 2008/0278864 | A1 | 11/2008 | Zhang et al. |

* cited by examiner

*Primary Examiner* — Angel A. Castro
(74) *Attorney, Agent, or Firm* — Saile Ackerman LLC; Stephen B. Ackerman

(57) ABSTRACT

A novel CCP scheme is disclosed for a CPP-GMR sensor in which an amorphous metal/alloy layer such as Hf is inserted between a lower Cu spacer and an oxidizable layer such as Al, Mg, or AlCu prior to performing a pre-ion treatment (PIT) and ion assisted oxidation (IAO) to transform the amorphous layer into a first metal oxide template and the oxidizable layer into a second metal oxide template both having Cu metal paths therein. The amorphous layer promotes smoothness and smaller grain size in the oxidizable layer to minimize variations in the metal paths and thereby improves dR/R, R, and dR uniformity by 50% or more. An amorphous Hf layer may be used without an oxidizable layer, or a thin Cu layer may be inserted in the CCP scheme to form a Hf/PIT/IAO or Hf/Cu/Al/PIT/IAO configuration. A double PIT/IAO process may be used as in Hf/PIT/IAO/Al/PIT/IAO or Hf/PIT/IAO/Hf/PIT/IAO schemes.

7 Claims, 1 Drawing Sheet

CPP DEVICE WITH A PLURALITY OF METAL OXIDE TEMPLATES IN A CONFINING CURRENT PATH (CCP) SPACER

FIELD OF THE INVENTION

The invention relates to a high performance magnetic read head element and a method for making the same, and in particular, to an amorphous metal layer or amorphous oxide layer that is formed on a copper spacer and subjected to a plasma treatment followed by an ion-assisted oxidation to form a confining current path (CCP) layer between an AP1 layer in the pinned layer stack and a free layer and thereby improve current perpendicular to plane (CPP) device uniformity.

BACKGROUND OF THE INVENTION

A CPP-GMR head where GMR refers to a giant magnetoresistive effect is considered as one promising sensor to replace the conventional CIP (current in plane) GMR head for over 200 Gb/in$^2$ recording density. GMR spin valve stacks typically have a configuration in which two ferromagnetic layers are separated by a non-magnetic conductive layer (spacer). One type of CPP-GMR sensor is called a metallic CPP-GMR that can be represented by the following configuration in which the spacer between the AP1 pinned layer and free layer is a copper layer and the following layers are sequentially formed on a substrate: Seed/AFM/AP2/Ru/AP1/Cu/free layer/capping layer. One of the ferromagnetic layers is a pinned layer in which the magnetization direction is fixed by exchange coupling with an adjacent anti-ferromagnetic (AFM) or pinning layer. The pinned layer may have a synthetic anti-parallel (SyAP) structure wherein an outer AP2 layer is separated from an inner AP1 layer by a coupling layer such as Ru. The second ferromagnetic layer is a free layer in which the magnetization vector can rotate in response to external magnetic fields. The rotation of magnetization in the free layer relative to the fixed layer magnetization generates a resistance change that is detected as a voltage change when a sense current is passed through the structure. In a CPP configuration, a sense current is passed through the sensor in a direction perpendicular to the layers in the stack. A lower resistance is detected when the magnetization directions of the free and pinned layers are in a parallel state ("1" memory state) and a higher resistance is noted when they are in an anti-parallel state or "0" memory state.

In a typical CPP-GMR sensor, a bottom synthetic spin valve film stack which is generally represented as [seed/AFM/pinned/spacer/free/cap] is employed for biasing reasons and a CoFe/NiFe composite free layer is conventionally used following the tradition of CIP-GMR technology.

Ultra-high density (over 100 Gb/in$^2$) recording requires a highly sensitive read head. To meet this requirement, the CPP configuration is a stronger candidate than the CIP configuration which has been used in recent hard disk drives (HDDs). The CPP configuration is more desirable for ultra-high density applications because a stronger output signal is achieved as the sensor size decreases, and the magnetoresistive (MR) ratio is higher for a CPP configuration. An important characteristic of a GMR head is the MR ratio which is dR/R where dR is the change in resistance of the spin valve sensor and R is the resistance of the spin valve sensor before the change. A higher MR ratio is desired for improved sensitivity in the device and this result is achieved when electrons in the sense current spend more time within the magnetically active layers of the sensor. Interfacial scattering which is the specular reflection of electrons at the interfaces between layers in the sensor stack can improve the MR ratio and increase sensitivity. Unfortunately, the MR ratio is often very low (<5%) in many CPP-GMR spin valve structures involving metal spacers. A MR ratio of ≧10% and an RA of <0.5 ohm-um$^2$ are desirable for advanced applications.

Another type of sensor is a so-called confining current path (CCP) CPP GMR sensor where the current through the Cu spacer is limited by the means of segregating metal path and oxide formation. With a CCP-CPP scheme, the Cu metal path is limited through an insulator template so that the MR ratio can be enhanced quite significantly. An example of a CCP-CPP GMR sensor has the following configuration: Seed/AFM/AP2/Ru/AP1/Cu/CCP layer/Cu/free layer/capping layer where the CCP layer is sandwiched between two copper layers. Typically, a CCP layer is formed by first growing an Al or AlCu layer on a Cu layer at the top of a crystalline stack of layers which results in rough surface morphology and large grain size with large distributions in the Al or AlCu film. In the ensuing pre-ion treatment (PIT) and ion-assisted oxidation (IAO) steps where Al or AlCu is exposed to oxygen to form a current confining path through Al$_2$O$_3$ and Cu segregation, it is inevitable that a rugged Al or AlCu layer leads to a non-uniform AlOx layer which means poor uniformity and a loss of control in device performance.

CCP layer formation is based on a well known fact that Al atoms have a different (higher) mobility than Cu atoms. After the PIT treatment, Al and Cu start to segregate from each other and when exposed to oxygen during the IAO step, Al attracts oxygen to form amorphous AlOx. Because Cu is more chemically inert to oxygen than Al under the process conditions, it tends to remain as a Cu metal phase and eventually forms a metal path.

In order for the CCP-CPP GMR approach to be widely accepted in manufacturing, a smoother CCP forming layer and one that has a morphology which enables more uniform metal paths to be formed during the PIT/IAO processes is required so that significant improvement in device uniformity can be achieved. A CCP forming layer is defined here as the one or more layers deposited on a Cu spacer which are subsequently transformed (with Cu) into the actual CCP layer as a result of the PIT and IAO processes.

During a routine search of the prior art, the following references were found. In U.S. Pat. No. 7,177,121, an amorphous metal layer made of an oxidized NiCr alloy or oxidized CoCr alloy is formed on the sides of a magnetoresistive element and beneath a magnetic domain control film, the magnetic characteristics of the magnetic domain control film are improved.

U.S. Patent Application Publication No. 2005/0094317 discloses a composite layer in a MTJ stack that is comprised of a central current control region and an insulating layer on either side of the central region. The central current control region is made of an oxide, nitride, or oxynitride of at least one of B, Si, Ge, Ta, W, Nb, Al, Mo, P, V, As, Sb, Zr, Ti, Zn, Pb, Th, Be, Cd, Sc, Y, Cr, Sn, Ga, In, Rh, Pd, Mg, Li, Ba, Ca, Sr, Mn, Fe, Co, Ni, Rb, and rare earth metals and may contain one type of metal such as Cu, Au, Ag, Pt, Pd, Ir, and Os.

U.S. Patent Application Publication No. 2003/0053269 describes a current confining layer made of Al$_2$O$_3$ or TaO$_2$ that is formed between a pinned layer and a free layer.

SUMMARY OF THE INVENTION

One objective of the present invention is to provide a CCP forming layer configuration during fabrication of a CPP device that promotes a smoother surface morphology as well as a smaller and more uniform grain size in the oxidizable portion of the CCP forming layer prior to the PIT and IAO processes.

A further objective of the present invention is to form metal oxide templates with improved uniformity during CPP device fabrication such that the Cu metal paths formed therein are more uniform than in a conventional CCP scheme involving segregated Cu metal paths in AlOx templates and thereby improve dR/R, dR, and R uniformity across the wafer.

These objectives are achieved according to the present invention by first providing a substrate on which a CPP-GMR sensor (CPP element) is to be fabricated. In one embodiment, the substrate is a bottom shield in a GMR read head and a CPP stack of layers having a bottom spin valve configuration is formed on the substrate by sequentially forming a seed layer, AFM layer, synthetic anti-parallel (SyAP) pinned layer, Cu spacer with CCP layer therein, free layer, and a cap layer in a sputter deposition system. Formation of the CCP layer is achieved by first depositing a CCP forming layer on a lower portion of the Cu spacer. A key feature is that the CCP forming layer is comprised of at least one amorphous layer made of metal, an alloy, or an oxide, and, in some embodiments has an oxidizable layer made of Al, AlCu, Mg, MgCu, Ti, Cr, Zr, Ta, Hf, Fe, or the like, or an alloy from one of the aforementioned elements. The amorphous layer is preferably Hf but also may be made of Zr, CoFeB, Ta, Nb, or the like. The amorphous layer will be oxidized to an oxide layer and its primary purpose is to provide a small grain size with smooth surfaces that (a) promotes more uniform Cu paths formed in a metal oxide template derived from the amorphous layer, and (b) improves the oxidizable layer surface morphology and reduces grain size and size distribution therein so that a more uniform metal oxide template derived from the overlying oxidizable layer is formed following plasma treatment and oxidation processes. One or more layers in the CCP forming layer is subjected to a PIT/IAO process sequence involving pre-ion treatment (PIT) followed by an ion-assisted oxidation (IAO), plasma oxidation, or radical oxidation step to transform the CCP forming layer and at least a portion of the Cu spacer into a CCP layer having one or more metal oxide templates with segregated Cu metal paths therein. Thereafter an upper portion of the copper spacer is deposited on the CCP layer to provide a CCP spacer represented by Cu/CCP layer/Cu.

In one aspect, the CCP scheme disclosed in the first embodiment may be represented by A/X/PIT/IAO where A is the amorphous layer made of metal, alloy, or oxide, and X is the oxidizable metal layer. PIT/IAO indicates that the A/X composite structure (CCP forming layer) was treated with a PIT step followed by an IAO step to form a first metal oxide template from the amorphous layer and a second metal oxide template from the oxidizable metal layer, both having segregated Cu metal paths therein. The first metal oxide template contacts the lower portion of the Cu spacer while the second metal oxide template contacts the upper portion of the Cu spacer. There may be some intermixing of first metal oxide template with the second metal oxide template. The first embodiment also encompasses an A/X/A/PIT/IAO configuration in which a second amorphous layer is deposited on the oxidizable metal layer before the PIT and IAO sequence is performed. In this case, a second metal oxide template derived from the "X" layer is formed between first and third metal oxide templates that are derived from the first and second amorphous metal or alloy layers, respectively. The present invention also provides for an A/PIT/IAO/X/PIT/IAO configuration where the A layer is subjected to the PIT and IAO treatments before the X layer is deposited and treated with the PIT and IAO steps.

In a second embodiment, the amorphous layer is employed as a CCP forming layer on the lower Cu spacer layer, and the oxidizable X layer is omitted. This configuration is represented by A/PIT/IAO. Alternatively, a double A layer configuration represented by A/PIT/IAO/A/PIT/IAO may be employed wherein a first A layer formed on the lower portion of the Cu spacer is treated with the PIT and IAO steps before a second A layer is deposited on the resulting metal oxide template and is subjected to the PIT/IAO sequence. The A/PIT/IAO/A/PIT/IAO CCP configuration can lead to improved uniformity because of more uniform oxidation at the top surface and via the grain boundaries in the "A" layers. In the second embodiment, the one or more A layers are transformed into a single metal oxide template with segregated Cu metal paths formed therein when the first and second A layers are comprised of the same metal or alloy. In one aspect, the first A layer may be made of a different metal or alloy than the second A layer thereby producing a second metal oxide template on the first metal oxide template.

There is a third embodiment similar to the second embodiment except a thin Cu layer is inserted between the two A layers. This configuration is represented by N/PIT/IAO/Cu/A/PIT/IAO. In this case, a Cu layer is deposited on the first metal oxide template generated by performing PIT and IAO processes on the first A layer. Then a second A layer is deposited on the Cu layer and PIT and IAO processes are performed a second time to produce a second metal oxide template on the first metal oxide template. In one aspect, the same metal or alloy is employed in both the first and second A layers to give essentially a single CCP layer having a metal oxide template and Cu metal paths therein. However, the first A layer may be comprised of a different metal or alloy than the second layer which would result in a composite CCP structure where the first metal oxide template derived from the first A layer is different than the second metal oxide template formed from the second A layer. Thereafter, the upper portion of the Cu spacer is deposited on the second metal oxide template to form a CCP spacer having a Cu/CCP layer/Cu configuration. Optionally, the third embodiment may have an A/Cu/A/PIT/IAO configuration in which a thin Cu layer is deposited on the first A layer followed by deposition of the second A layer on the thin Cu layer before the PIT and IAO steps are performed.

In a fourth embodiment, the CCP configuration of the first embodiment is modified by inserting a thin Cu layer between the A layer and the X layer as in A/Cu/X/PIT/IAO. Alternatively, the A layer may be subjected to PIT and IAO process steps before a Cu layer is deposited on the resulting first metal oxide template derived from the A layer. Then the X layer is deposited on the thin Cu layer followed by PIT and IAO process steps to generate a second metal oxide template on the first metal oxide template in which both metal oxide templates have Cu paths therein. This scheme is represented by A/PIT/IAO/Cu/X/PIT/IAO.

The present invention also encompasses a method of forming the CPP-GMR element comprised of the aforementioned Cu/CCP layer/Cu spacer configurations. All layers in the CPP-GMR element are preferably formed in a sputter deposition system that includes one or more sputter deposition chambers and at least one oxidation chamber. The PIT process may be performed in a sputter deposition chamber followed by an IAO process in an oxidation chamber of a sputter deposition mainframe. After all layers in the CPP-GMR element are laid down on the substrate, a conventional patterning and etching sequence may then be followed to define the shape of the CPP-GMR element. Subsequently, a dielectric layer and a hard bias layer may be formed adjacent to the sidewalls of the CPP-GMR element in the CCP-CPP GMR sensor.

DETAILED DESCRIPTION OF THE INVENTION

The present invention is a confining current path scheme for a CCP spacer between a pinned layer and a free layer in a magnetoresistive element such as a CPP-GMR sensor. The drawings are provided by way of example and are not intended to limit the scope of the invention. Although the exemplary embodiments describe a bottom spin valve structure, the confining current path scheme of the present invention may also be employed in a top spin valve structure or a multilayer spin valve configuration in a CPP-GMR element as appreciated by those skilled in the art. The present invention is also a method of making a CCP-CPP GMR sensor with improved uniformity compared with a conventional CCP-CPP GMR design involving Cu paths in a metal oxide template. The terms "device", "sensor", and "element" may be used interchangeably.

It is well known in conventional CCP schemes that the top surface of an oxidizable Al or AlCu layer formed on a Cu spacer is rough prior to the PIT and IAO process sequence. Furthermore, when the Al or AlCu layer is oxidized to form AlOx templates for the Cu metal paths, the volume of the CCP layer may expand by as much as 30% which increases surface roughness on the metal oxide template. Since the Cu metal paths are formed through the grain boundaries of the rough AlOx templates, the Cu metal paths have a large variation in terms of width and length thereby leading to large variations in RA and dR/R for the plurality of sensor devices fabricated across the wafer. The inventors have discovered that by first depositing an amorphous layer made of metal, alloy, or oxide on the Cu spacer, the overlying oxidizable portion of the CCP forming layer will have a smoother surface and smaller grain size to promote more uniform Cu metal paths in the resulting metal oxide template following the PIT and IAO process steps. Moreover, an amorphous layer made of metal or alloy that is oxidizable and formed on a Cu spacer may be employed without an overlying oxidizable layer in a CCP scheme with similar improvement in device uniformity.

Figure 1:
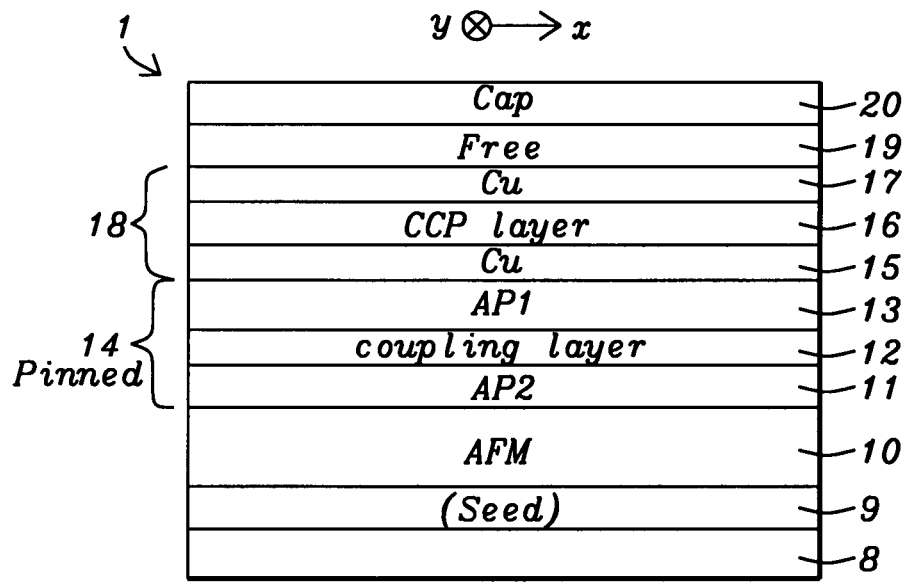
FIG. 1 is a cross-sectional view of a CPP-GMR sensor with a stack of layers in which a confining current path (CCP) spacer is formed between an AP1 pinned layer and the free layer according to one embodiment of the present invention.

Referring to FIG. 1, one embodiment of the present invention is shown that relates to a CCP-CPP GMR sensor 1 having a bottom spin valve structure. The view in FIG. 1 is from a cross-section along an air bearing surface (ABS) in the read head. A substrate 8 is shown that may be a first magnetic shield (S1) in a read head. For example, the substrate 8 may be comprised of a 2 micron thick layer of an electroplated permalloy. There is a seed layer 9 that may be comprised of a lower Ta layer and an upper Ru layer (not shown) formed on the substrate 8. The seed layer 9 promotes a smooth and uniform crystal structure in the overlying AFM and pinned layers that enhances the MR ratio in the CCP-CPP GMR sensor 1.

An AFM layer 10 is formed on the seed layer 9 and is preferably comprised of IrMn having a composition of about 18 to 22 atomic % Ir and a thickness of about 50 to 75 Angstroms. Alternatively, the AFM layer 10 may be made of MnPt having a composition between about 55 to 65 atomic % manganese and with a thickness of about 125 to 175 Angstroms. Those skilled in the art will appreciate that other materials such as NiMn, OsMn, RuMn, RhMn, PdMn, RuRhMn, or PtPdMn may also be employed as the AFM layer 10 which is used to pin the magnetization direction in an overlying ferromagnetic (pinned) layer 14.

There is a synthetic anti-parallel (SyAP) pinned layer 14 formed on the AFM layer 10 that preferably has an AP2/coupling layer/AP1 configuration. The AP2 layer 11 in the pinned layer may be comprised of CoFe with a composition of about 75 to 90 atomic % cobalt and a thickness of about 20 to 50 Angstroms and is formed on the AFM layer 10. The magnetic moment of the AP2 layer 11 is pinned in a direction anti-parallel to the magnetic moment of the AP1 layer 13. For example, the AP2 layer may have a magnetic moment oriented along the "+x" direction while the AP1 layer has a magnetic moment in the "-x" direction. The AP2 layer 11 may be slightly thicker than the AP1 layer to produce a small net magnetic moment for the pinned layer 14. Exchange coupling between the AP2 layer 11 and the AP1 layer 13 is facilitated by a coupling layer 12 that is preferably comprised of Ru with a thickness of about 7.5 Angstroms. Optionally, Rh or Ir may be employed as the coupling layer 12.

The AP1 layer 13 may be a composite with a $[CoFe/Cu]_k/$CoFe configuration wherein k=1, 2, or 3. In an embodiment where k=1, the AP1 layer 13 may be comprised of a stack wherein the first and third layers (not shown) are made of CoFe with a Fe content of 50 to 90 atomic % and a thickness between 10 and 20 Angstroms, and preferably 18 Angstroms, and the second (middle) layer is made of Cu with a thickness of 0.5 to 4 Angstroms and preferably 2 Angstroms. The use of a laminated AP1 layer to improve CPP-GMR properties is well known in the art. All of the CoFe and Cu layers in the AP1 layer 13 have a magnetic moment in the "-x" direction when the AP1 layer has a magnetic moment along the "-x" axis in the exemplary embodiment. Optionally, the AP1 layer 13 may be made of CoFe or a composite comprised of CoFe and CoFeB.

A key feature of the present invention is a CCP spacer 18 formed on the AP1 layer 13. The CCP spacer 18 is a composite comprised of a confining current path (CCP) layer sandwiched between two Cu layers 15, 17 each having a thickness from 0 to about 10 Angstroms. It should be understood that the first step in forming the CCP spacer 18 is depositing a first Cu layer 15 on the AP1 layer 13. Alternatively, in a top spin valve, the CCP spacer 18 may be formed on a free layer. In a first embodiment, a CCP forming layer (not shown) is formed on the first Cu layer 15 and is comprised of at least one amorphous layer made of a metal, alloy, or an oxide and hereafter referred to as the "A" layer, and an oxidizable layer comprised of Al, AlCu, Mg, MgCu, Ti, Cr, Zr, Ta, Hf, Fe, or the like, or an alloy from one of the aforementioned elements and hereafter referred to as the "X" layer. The A layer made of metal or alloy has a thickness from 1 to 15 Angstroms while the X layer has a thickness from about 1 to 15 Angstroms. When the A layer is an amorphous oxide, the preferred thickness is less than 15 Angstroms.

In one aspect, the X layer is formed above the A layer. The A layer may be made of Hf, Zr, CoFeB, Ta, Nb, Ti, or B for example, and serves to promote a smoother surface morphology and smaller grain size in an overlying X layer. Thus, in a subsequent process sequence involving PIT and IAO steps, the metal oxide template resulting from oxidation of the X layer will have a smoother surface texture and the Cu metal paths formed at the grain boundaries will have improved uniformity compared with the Cu metal paths formed within typical AlOx templates. Preferably, the A layer is also oxidizable and is believed to form an oxide template with Cu metal paths therein. The amorphous nature of the A layer means the small grain size and smooth surfaces in the A layer promote the formation of uniform Cu metal paths therein in subsequent PIT and IAO processing. There may be a gradual transition from a metal oxide template made of essentially oxidized A layer near the interface with the first Cu layer 15 to a metal oxide template made of essentially oxidized X layer at the top of the CCP layer 16 following the PIT/IAO steps. Thereafter, a second Cu layer 17 is deposited on the CCP layer 16 to complete the CCP spacer 18. It should be understood that at least a portion of the first Cu layer 15 reacts to form the Cu paths in the metal oxide templates. Preferably, a portion of the first Cu layer 15 remains on the AP1 layer 13 following the IAO process to serve as an oxygen barrier so that the magnetic material in the AP1 layer is not oxidized which could lower the MR ratio and otherwise degrade the performance of the CCP-CPP GMR sensor 1.

The CCP forming layer in the first embodiment may be represented by an A/X/PIT/IAO configuration which indicates the A layer is formed on the first Cu spacer layer 15 and the X layer is deposited on the A layer prior to performing the PIT and IAO processes. During the PIT/IAO processes, the CCP forming layer and a portion of the first Cu layer 15 are transformed into the CCP layer 16. In one aspect, the lower Cu layer 15 is about 2 to 8 Angstroms thick and preferably 5.2 Angstroms thick, and the upper Cu layer 17 has a thickness between 2 and 6 Angstroms and is preferably 3 Angstroms thick. The first metal oxide template in the CCP layer 16 may have a thickness of 2 to 15 Angstroms and the second metal oxide template may have a thickness of 2 to 15 Angstroms.

A typical PIT process is performed in a sputter deposition chamber within a sputter deposition mainframe that preferably contains at least one sputter deposition chamber and at least one oxidation chamber. One example of a PIT process employed by the inventors comprises a RF power of 5 to 200 Watts and an Ar flow of 10 to 200 standard cubic centimeters per minute (sccm) for 5 to 200 seconds. The IAO process may be performed in an oxidation chamber of a sputter deposition mainframe and may be comprised of an Ar flow rate of 5 to 200 sccm, an oxygen flow rate of 0.01 to 100 sccm, and a RF power of 5 to 200 Watts for 5 to 2000 seconds.

The first embodiment also encompasses an A/X/A/PIT/IAO configuration in which a second amorphous (A) layer is deposited on the X layer before the PIT and IAO sequence is performed. For example, when A is Hf and X is Mg, then a first hafnium oxide template is formed on the first Cu layer 15 and a MgO template is formed on the first hafnium oxide template. There is also a second hafnium oxide template formed on the MgO template with segregated Cu metal paths formed within each of the three aforementioned metal oxide templates. Optionally, the amorphous metal or amorphous alloy selected for the second A layer may be different than the material in the first A layer. As a result, each of the three metal oxide templates in the CCP layer 16 may be comprised of a different metal and has a thickness of 1 to 15 Angstroms. It should be understood that the boundaries between adjacent metal oxide layers may not be clearly defined since some intermixing of metal oxide templates can occur during the PIT and IAO processes. Furthermore, the Cu density in the second and third metal oxide templates may be less than in the first metal oxide template since the Cu must migrate a greater distance to reach the second and third metal oxide templates.

The first embodiment also provides for an A/PIT/IAO/X/PIT/IAO configuration where the A layer is subjected to the PIT and IAO treatments before the X layer is deposited and treated with the PIT and IAO steps. In this case, a first metal oxide template made of oxidized A layer is formed on the first Cu layer 15 and a second metal oxide template made of oxidized X layer is formed on the first metal oxide template. The concentration of metal paths formed in the first metal template may be greater than in the second metal oxide template since Cu from the lower Cu layer 15 must migrate a larger distance to reach the second metal oxide template.

In another aspect, the X layer may be formed on the lower Cu layer 15 followed by deposition of the A layer on the X layer. Thus, the first embodiment also encompasses an X/A/PIT/IAO configuration in which an amorphous A layer is deposited on the X layer before the PIT and IAO processes are performed. For example, a Mg/Hf/PIT/IAO configuration may be used to form a MgO template on the lower Cu layer 15 and a hafnium oxide template on the MgO template. As a result of the PIT/IAO sequence, both metal oxide templates contain Cu metal paths. Thereafter, the upper Cu layer 17 is deposited on the resulting CCP layer 16.

In a second embodiment, at least one A layer is employed and the X layer is omitted in the CCP forming layer. This configuration may be represented by A/PIT/IAO. The A layer formed on the first Cu layer 15 is treated with PIT and IAO processes to form a metal oxide template with Cu metal paths therein to produce a CCP layer 16 having a thickness of about 5 to 25 Angstroms on the remaining portion of first Cu layer 15. An important requirement for formation of a segregated Cu metal path in a metal oxide template is that the metal should be more readily oxidized than Cu and should have a different mobility than Cu. Preferably, the A layer metal or alloy has a higher mobility than Cu, but in principle, an A layer material that has a lower mobility than Cu is also acceptable. Thereafter, the second Cu layer 17 is deposited on the CCP layer 16.

Alternatively, a double A layer configuration represented by A/PIT/IAO/A/PIT/IAO may be employed wherein a first A layer (not shown) formed on the first Cu layer 15 is treated with the PIT and IAO steps to form a first metal oxide template before a second A layer is deposited on the first metal oxide template having segregated Cu metal paths therein and is subjected to the PIT/IAO sequence to form a second metal oxide template having segregated Cu metal paths therein. When the first A layer is comprised of the same material as in the second A layer, then the resulting CCP layer 16 has essentially the same metal oxide composition throughout. Depending on the thicknesses of the two A layers, a lower portion of the CCP layer 16 may have a higher concentration of Cu metal paths than an upper portion because the first A layer is closer to the first Cu layer 15 during the PIT/IAO sequence. The A/PIT/IAO/A/PIT/IAO CCP configuration can lead to improved uniformity because of more uniform oxidation at the top surface and via the grain boundaries in the two A layers. It should be understood that the second A layer may be made of a different amorphous material than in the first A layer. The first metal oxide template has a thickness of 2 to 15 Angstroms and the second metal oxide template has a thickness of 2 to 15 Angstroms.

There is a third embodiment similar to the second embodiment except a thin Cu layer (not shown) is inserted between the two A layers. The thin Cu layer has a thickness from 0 to 6 Angstroms and preferably less than 3 Angstroms. This configuration may be represented by A/PIT/IAO/Cu/A/PIT/

IAO. In this case, a thin Cu layer is deposited on the first metal oxide template generated by performing PIT and IAO processes on the first A layer. Then a second A layer is deposited on the thin Cu layer and PIT and IAO processes are performed a second time to produce a second metal oxide template on the first metal oxide template. In one aspect, the same metal or alloy is employed in both the first and second A layers to give a CCP layer 16 having essentially a single metal oxide template and Cu metal paths therein. However, the first A layer may be comprised of a different metal or alloy than the second A layer which would result in a composite CCP structure where the first metal oxide template in a lower portion of the CCP layer 16 is different than the second metal oxide template in an upper portion of the CCP layer. Thereafter, the upper portion of the Cu spacer is deposited on the CCP layer 16 to complete the CCP spacer 18. Optionally, the third embodiment may have a A/Cu/A/PIT/IAO configuration in which a thin Cu layer is deposited on the first A layer followed by deposition of the second A layer on the thin Cu layer before the PIT and IAO steps are performed. This configuration is believed to generate a CCP layer 16 having a more uniform Cu metal path distribution throughout since the Cu used to form metal paths in the second metal oxide template does not need to migrate through the first A layer.

In a fourth embodiment, the CCP configuration of the first embodiment is modified by inserting a thin Cu layer from 0 to 6 Angstroms thick between the A layer and the X layer to give an A/Cu/X/PIT/IAO scheme. In this case, the CCP layer 16 is comprised of a first metal oxide template formed from the A layer and a second metal oxide template formed from the X layer as a result of the PIT and IAO process sequence. Alternatively, the A layer may be subjected to PIT and IAO process steps before a thin Cu layer is deposited on the resulting first metal oxide template made from the A layer. Then the X layer is deposited on the thin Cu layer followed by PIT and IAO process steps to generate a second metal oxide template on the first metal oxide template wherein both metal oxide templates have Cu metal paths formed therein. This scheme is represented by A/PIT/IAO/Cu/X/PIT/IAO. In this example, the first metal oxide template in the CCP layer 16 has a different composition than the second metal oxide template.

Above the CCP spacer 18 is a free layer 19 that may be comprised of CoFe. Alternatively, the free layer 19 may be a composite in which a bottom layer made of CoFe is formed on the CCP spacer 18 and a NiFe layer is disposed on the CoFe layer. The present invention also anticipates that other soft magnetic materials may be employed as the free layer 19 in the GMR-CPP sensor 1.

At the top of the CPP-GMR sensor stack is a cap layer 20 that may be a composite comprised of a lower Ru layer on the free layer 19 and a Ta layer on the Ru layer. Optionally, the cap layer 20 may be comprised of a composite such as Ru/Ta/Ru or other suitable capping layer materials used by those skilled in the art.

All of the layers in the CPP stack in CCP-CPP GMR sensor 1 may be laid down in a sputter deposition system. For instance, the CPP-GMR stack of layers may be formed in an Anelva C-7100 thin film sputtering system or the like which typically includes three physical vapor deposition (PVD) chambers each having 5 targets, an oxidation chamber, and a sputter etching chamber. At least one of the PVD chambers is capable of co-sputtering. Typically, the sputter deposition process involves an argon sputter gas and the targets are made of metal or alloys to be deposited on a substrate. All of the CPP layers may be formed after a single pump down of the sputter system to enhance throughput.

The present invention also encompasses an annealing step after all of the CPP-GMR layers have been deposited. For example, the CPP-GMR stack comprised of seed layer 9, AFM layer 10, pinned layer 14, CCP spacer 18, free layer 19, and cap layer 20 may be annealed by applying a magnetic field of about 10K Oe in magnitude along a certain axis for about 0.5 to 20 hours at a temperature between 250° C. and 350° C. The annealing process may also comprise an annealing step along a hard axis and an annealing step along an easy axis.

Figure 2:
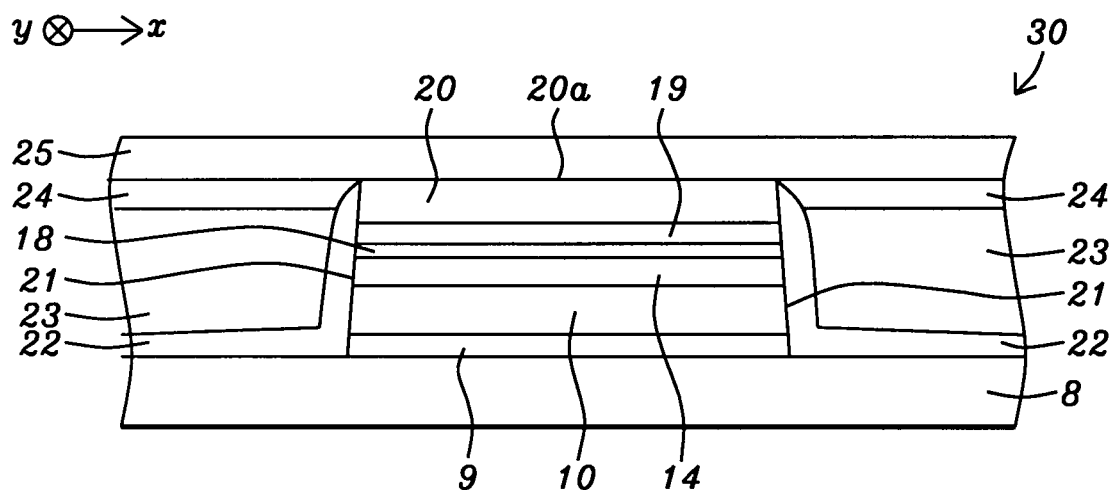
FIG. 2 is a cross-sectional view of a read head comprised of a CPP-GMR sensor according to the present invention.

Referring to FIG. 2, a CCP-CPP GMR head 30 having a CPP-GMR element comprised of layers 9-20 and with sidewalls 21 and a top surface 20a may be fabricated by coating and patterning a photoresist layer (not shown) on the cap layer surface 20a after all of the layers in the CPP-GMR stack are deposited. The photoresist layer serves as an etch mask during an ion beam etch (IBE) or reactive ion etch (RIE) sequence that transfers the pattern through the CPP-GMR stack of layers to form the sidewalls 21 that are typically sloped so that the top surface 20a has a smaller width along the x-axis than that of the seed layer 9. Once the etch sequence is complete, the photoresist layer may be removed by a conventional stripping process known to those skilled in the art.

Thereafter, a first dielectric layer 22 made of $Al_2O_3$ or the like with a thickness of about 100 to 150 Angstroms is deposited on the bottom shield 8 and along the sidewalls 21 of the CPP-GMR element by a chemical vapor deposition (CVD) or physical vapor deposition (PVD) method. Optionally, a seed layer (not shown) such as TiW, Cr, CrTi, or CrMo may be formed on the first dielectric layer. Next, a hard bias layer 23 that may be comprised of CoCrPt or FePt is deposited on the first dielectric layer 22 (or seed layer) by an ion beam deposition (IBD) or PVD process. In an alternative embodiment, a soft magnetic underlayer such as NiFe, CoFe, CoNiFe, FeTaN, or FeAlN is formed on a seed layer to promote good lattice matching between the seed layer and hard bias layer 23. Then a second dielectric layer 24 is deposited on the first dielectric layer 22 and on the hard bias layer 23 with a CVD or PVD method, for example. In one embodiment, the hard bias layer 23 has a thickness of about 200 to 400 Angstroms and the second dielectric layer 24 has a thickness between about 150 and 250 Angstroms. A planarization step such as a chemical mechanical polish (CMP) process may be employed to make the second dielectric layer 24 coplanar with the top surface 20a of the cap layer 20. An upper shield 25 is disposed on the top surface 20a of the cap layer 20 and on the second dielectric layer 24. The upper shield 25 may be a composite layer such as Ta/NiFe as appreciated by those skilled in the art.

The advantages of incorporating a CCP layer 16 as described herein within a CCP spacer in a CPP GMR sensor are improved dR/R, dR, and R uniformity over CCP schemes involving conventional metal oxide templates with segregated Cu metal paths. Moreover, the amorphous layer inserted into the CCP forming layer is believed to minimize the threat of oxygen diffusion from the metal oxide template derived from the oxidizable metal into the AP1 layer and thereby avoids degradation in sensor performance. Several examples of CCP configurations in accordance with the present invention are described below.

COMPARATIVE EXAMPLE 1

An experiment was conducted to demonstrate the improved performance of a CPP-GMR stack of layers comprised of a seed layer, IrMn AFM layer, SyAP pinned layer, CCP spacer of the present invention, free layer, and cap layer that were sequentially formed on a AlTiC substrate. In this example, the seed layer has a 10 Angstrom thick Ta lower layer and a 10 Angstrom thick Ru upper layer, the IrMn AFM layer has a thickness of 70 Angstroms, the AP2 trilayer has a $Fe_{10}Co_{90}/Fe_{70}Co_{30}/Fe_{10}Co_{90}$ configuration, the AP1 layer is a $Fe_{70}Co_{30}/Cu/Fe_{70}Co_{30}$ laminate, the free layer is a $Fe_{25}Co_{75}/CoFeB/Ni_{90}Fe_{10}$ composite, and the cap layer has a Ru/Ta/Ru configuration. The value next to each layer in the reference configuration below indicates the film thickness in Angstroms. The reference sample labeled BTF2B3N has a CCP layer with AlOx and Cu metal paths therein and is formed by treating a Cu/Al/PIT/IAO configuration with a PIT process comprised of a RF power of 20 Watts and an Ar flow rate of 50 sccm for 35 seconds, and an IAO process comprised of a RF power of 27 Watts, an Ar flow rate of 35 sccm and an oxygen flow rate of 0.56 sccm for 40 seconds. The uniformity data for the reference CCP-CPP GMR sensor structure represented by $Ta10/Ru10/IrMn70/Fe_{10}Co_{90}8/Fe_{70}Co_{30}10.5/Fe_{10}Co_{90}16/Ru7.5/Fe_{70}Co_{30}12/Cu2/Fe_{70}Co_{30}12/Cu5.2/AlCu8.6/PIT/IAO/Cu3/Fe_{25}CO_{75}12/CoFeB10/Ni_{90}Fe_{10}35/Ru10/Ta60/Ru30$ is provided in Table 1.

TABLE 1 dR/R, dR, and R uniformity data for various device sizes for BTF2B3N under a conventional PIT/IAO process

| BTF2B3N device size | FLL | Area | dR/R Uniformity (%) | dR Uniformity (%) | R Uniformity (%) |
|---|---|---|---|---|---|
| 2B | 0.61 | 0.288 | 11.232 | 25.323 | 15.679 |
| 2A | 0.49 | 0.189 | 8.658 | 22.605 | 16.747 |
| 1D | 0.80 | 0.515 | 12.062 | 23.766 | 13.726 |
| 1C | 0.37 | 0.105 | 9.031 | 26.497 | 19.982 |
| 1B | 0.30 | 0.073 | 7.437 | 26.446 | 20.916 |
| 1A & 2C | 0.24 | 0.047 | 8.814 | 23.631 | 22.290 |

Typically, the 1 sigma uniformity data across the wafer ranges from 7% to 15% for dR/R, 20% to 30% for dR, and 15% to 30% for R. These large values for conventional CCP schemes are due to large variations in Cu metal paths formed within the rugged and non-uniform aluminum oxide templates generated during the PIT/IAO processes.

The inventors have achieved a substantial improvement in uniformity by inserting an amorphous layer (Hf) between a lower Cu spacer and an oxidizable Al layer in a CCP scheme represented by A/X/PIT/IAO where A=Hf and X=Al according to one embodiment of the present invention. In other words, a thin amorphous Hf layer is deposited on the lower Cu spacer before an Al layer is grown. The same PIT and IAO process conditions were employed as in the reference to form a CCP layer. The CCP-CPP GMR sensor (BTF3A0) with improved uniformity fabricated from a CCP forming layer configuration Hf/Al/PIT/IAO is represented by $Ta10/Ru20/IrMn70/Fe_{10}Co_{90}12/Fe_{70}Co_{30}17/Fe_{10}Co_{90}24/Ru7.5/Fe_{70}Co_{30}18/Cu2/Fe_{70}Co_{30}18/Cu5.2/Hf3/A17/PIT/IAO/Cu3/Fe_{25}CO_{75}12/CoFeB10/Ni_{90}Fe_{10}35/Ru10/Ta60/Ru30$. Results are shown in Table 2. Note that dR/R, R, and dR one sigma uniformity are reduced by 50% or more for all device sizes compared with the reference data in Table 1.

TABLE 2 dR/R, dR, and R uniformity data for various device sizes for BTF3A0 under the new CCP scheme with amorphous layer insertion before PIT/IAO processing.

| BTF3A0 device size | FLL | Area | dR/R Uniformity (%) | dR Uniformity (%) | R Uniformity (%) |
|---|---|---|---|---|---|
| 2B | 0.61 | 0.288 | 4.370 | 6.687 | 6.439 |
| 2A | 0.49 | 0.189 | 4.350 | 7.401 | 3.574 |
| 1D | 0.80 | 0.515 | 3.048 | 3.382 | 4.761 |
| 1C | 0.37 | 0.105 | 4.466 | 8.551 | 4.486 |
| 1B | 0.30 | 0.073 | 3.916 | 10.564 | 7.597 |
| 1A & 2C | 0.24 | 0.047 | 4.781 | 10.847 | 6.848 |

In another example that represents an A/X/A/PIT/IAO CCP scheme, a CCP-CPP GMR sensor (BTF3FG) was formed with the following structure: $Ta10/Ru20/IrMn70/Fe_{10}Co_{90}12/Fe_{70}Co_{30}17/Fe_{10}Co_{90}24/Ru7.5/Fe_{70}CO_{30}18/Cu2/Fe_{70}Co_{30}18/Cu5.2/Hf3/A12/Hf3/PIT/IAO/Cu3/Fe_{25}Co_{75}12/CoFeB10/Ni_{90}Fe_{10}35/Ru10/Ta60/Ru30$. In this embodiment, a first Hf layer is deposited on a lower Cu spacer followed by deposition of an Al layer and then a second Hf layer before the PIT/IAO sequence is performed. An upper Cu spacer is deposited on the resulting CCP layer having a stack of three metal oxide templates before the free layer is formed. In another example that represents an A/X/A/PIT/IAO CCP scheme where Al is replaced by Mg as the oxidizable "X" layer, a CCP-CPP GMR sensor (BTF39J) was formed with the following structure: $Ta10/Ru20/IrMn70/Fe_{10}Co_{90}12/Fe_{70}Co_{30}17/Fe_{10}Co_{90}24/Ru7.5/Fe_{70}Co_{30}18/Cu2/Fe_{70}Co_{30}18/Cu5.2/Hf3/Mg4/Hf3/PIT/IAO/Cu3/Fe_{25}Co_{75}12/CoFeB10/Ni_{90}Fe_{10}35/Ru10/Ta60/Ru30$. In this embodiment, a first Hf layer is deposited on a lower Cu spacer followed by deposition of a Mg layer and then a second Hf layer before the PIT/IAO sequence is performed. An upper Cu spacer is deposited on the resulting CCP layer before the free layer is formed. In the two A/X/A/PIT/IAO examples, the amorphous like Hf/Al/Hf or Hf/Mg/Hf trilayer configuration is treated with a PIT/IAO process sequence. Since the grain size is further decreased in the CCP forming layer compared with the A/X/PIT/IAO embodiment, more uniform oxidation and better uniformity can be realized.

In another example that represents an A/PIT/IAO CCP scheme, a CCP-CPP GMR sensor (BTF3C6) was formed with the following structure: $Ta10/Ru20/IrMn70/Fe_{10}Co_{90}12/Fe_{70}Co_{30}17/Fe_{10}Co_{90}24/Ru7.5/Fe_{70}Co_{30}18/Cu2/Fe_{70}CO_{30}18/Cu5.2/Hf8/PIT/IAO/Cu3/Fe_{25}Co_{75}12/CoFeB10/Ni_{90}Fe_{10}35/R10/Ta60/Ru30$. In this embodiment, a Hf layer is treated with the PIT/IAO sequence without an overlying Al or AlCu layer. Since Hf is amorphous, the oxidation will be more uniform from the top surface and via the grain boundary than when an A/X/PIT/IAO scheme is employed. Therefore, better uniformity can be realized.

In an example that represents an A/PIT/IAO/A/PIT/IAO CCP scheme according to the present invention, a CCP-CPP GMR sensor was formed with the following structure: $Ta10/Ru20/IrMn70/Fe_{10}Co_{90}12/Fe_{10}Co_{30}17/Fe_{10}Co_{90}24/Ru7.5/Fe_{70}Co_{30}18/Cu2/Fe_{70}Co_{30}18/Cu5.2/Hf3/PIT/IAO/Hf3/PIT/IAO/Cu3/Fe_{25}Co_{70}12/CoFeB10/Ni_{90}Fe_{10}35/Ru10/Ta60/Ru30$. A first amorphous Hf layer is deposited on the lower Cu spacer and is treated with a PIT/IAO sequence to give a hafnium oxide template with Cu metal paths therein before a second amorphous Hf layer is deposited on the first hafnium oxide template and a second PIT/IAO sequence is performed to generate a second hafnium oxide template with Cu paths therein. In effect, the A/PIT/IAO/A/PIT/IAO scheme represents a double nano-oxidation layer (NOL) process. The first and second amorphous hafnium layers replace the Al or AlCu layer in a conventional CCP design. Since both amorphous hafnium layers were subjected to the PIT/IAO processes, the amorphous nature of the Hf layer results in a more uniform oxidation from the top surface and via the grain boundaries. Therefore better uniformity can be realized.

A modification of the previous sample that represents an A/PIT/IAO/Cu/A/PIT/IAO CCP scheme according to one embodiment of the present invention is shown in the following structure: Ta10/Ru20/IrMn70/$Fe_{10}Co_{90}$12/$Fe_{70}CO_{30}$17/$Fe_{10}Co_{90}$24/Ru7.5/$Fe_{70}Co_{30}$18/Cu2/$Fe_{70}Co_{30}$18/Cu5.2/Hf3/PIT/IAO/Cu/Hf3/PIT/IAO/Cu3/$Fe_{25}CO_{75}$12/CoFeB10/$Ni_{90}Fe_{10}$35/Ru10/Ta60/Ru30. The thin Cu layer formed on the first hafnium oxide template is believed to form a more uniform concentration of Cu metal paths in the resulting CCP layer and thereby improves uniformity.

In yet another modification of the A/PIT/IAO CCP scheme, a thin Cu layer is inserted between two A layers prior to performing the PIT/IAO sequence. For example, a first Hf layer, a thin Cu layer, and a second Hf layer are sequentially deposited on a lower Cu spacer before applying the PIT/IAO process steps. A structure formed according to an A/Cu/A/PIT/IAO embodiment of the present invention is represented by the structure: Ta10/Ru20/IrMn70/$Fe_{10}Co_{90}$12/$Fe_{70}CO_{30}$17/$Fe_{10}Co_{90}$24/Ru7.5/$Fe_{70}Co_{30}$18/Cu2/$Fe_{70}Co_{30}$18/Cu5.2/Hf3/Cu2/Hf3/PIT/IAO/Cu3/$Fe_{25}Co_{75}$12/CoFeB10/$Ni_{90}Fe_{10}$35/Ru10/Ta60/Ru30. The thin Cu layer formed between the two amorphous hafnium layers is believed to form a more uniform concentration of Cu metal paths in the resulting CCP layer and thereby improves uniformity.

While this invention has been particularly shown and described with reference to, the preferred embodiment thereof, it will be understood by those skilled in the art that various changes in form and details may be made without departing from the spirit and scope of this invention.

We claim:

1. A magnetic sensor structure comprised of a pinned layer, free layer, and a confining current path (CCP) spacer formed between the pinned and free layers wherein the CCP spacer comprises:
    (a) a first copper layer formed on the pinned layer;
    (b) a spacer formed between the first copper layer and a second copper layer, comprising:
        (1) a first metal oxide template comprised of an oxide of Hf, Zr, CoFeB, Ta, Nb, Ti, or B or another amorphous metal or amorphous alloy, wherein the at-least one first metal oxide template has segregated Cu metal paths formed therein; and
        (2) at least a second metal oxide template which forms an interface with the first metal oxide template and is comprised of an oxide of a metal or metal alloy with segregated Cu metal paths formed therein; and
    (c) the second copper layer formed on a top surface of the first metal oxide template or the at least second metal oxide template, said second copper layer contacts said free layer.

2. The magnetic sensor structure of claim 1 wherein the first metal oxide template has a thickness between about 2 and 15 Angstroms and contacts said first Cu layer, and a the at least second metal oxide template contacts the second Cu layer and is comprised of an oxide of Al, AlCu, Mg, MgCu, Ti, Cr, Zr, Ta, Hf, or Fe and has a thickness from about 2 to 15 Angstroms.

3. The magnetic sensor structure of claim 1 wherein the spacer is comprised of two metal oxide templates said first metal oxide template and a second metal oxide template are each made of an oxide of Hf, Zr, CoFeB, Ta, Nb, Ti, or B having Cu metal paths therein and with a thickness between about 2 and 15 Angstroms and said first metal oxide template is comprised of a different metal than in the second metal oxide template.

4. The magnetic sensor structure of claim 1 wherein the spacer between the first and second copper layers is comprised of:
    (a) a first metal oxide template made of an oxide of Hf, Zr, CoFeB, Ta, Nb, Ti, or B having segregated Cu metal paths therein and with a thickness between about 1 and 15 Angstroms that contacts said first Cu layer;
    (b) a second metal oxide template formed on the first metal oxide template and that is comprised of an oxide of Al, AlCu, Mg, MgCu, Ti, Cr, Zr, Ta, Hf, or Fe having segregated Cu metal paths formed therein, said second metal oxide template has a thickness from about 1 to 15 Angstroms; and
    (c) a third metal oxide template made of an oxide of Hf, Zr, CoFeB, Ta, Nb, Ti, or B having segregated Cu metal paths therein and with a thickness between about 1 and 15 Angstroms that contacts said second Cu layer and wherein said third metal oxide template is made of the same metal oxide as in the first metal oxide template.

5. The magnetic sensor structure of claim 1 wherein the spacer formed between the first and second copper layers is comprised of:
    (a) a first metal oxide template made of an oxide of Hf, Zr, CoFeB, Ta, Nb, Ti, or B having segregated Cu metal paths therein and with a thickness between about 1 and 15 Angstroms that contacts said first Cu layer;
    (b) a second metal oxide template formed on the first metal oxide template and is comprised of an oxide of Al, AlCu, Mg, MgCu, Ti, Cr, Zr, Ta, Hf, or Fe having segregated Cu metal paths formed therein, said second metal oxide template has a thickness from about 1 to 15 Angstroms; and
    (c) a third metal oxide template made of an oxide of Hf, Zr, CoFeB, Ta, Nb, Ti, or B having segregated Cu metal paths therein and with a thickness between about 1 and 15 Angstroms that contacts said second Cu layer and wherein said third metal oxide template is made of a different metal oxide than in the first metal oxide template.

6. The magnetic sensor structure of claim 1 wherein the first copper layer has a thickness from 0 to about 10 Angstroms and the second copper layer has a thickness from 0 to about 10 Angstroms.

7. The magnetic sensor structure of claim 1 wherein the first metal oxide template has a thickness between about 2 and 15 Angstroms and contacts said second Cu layer, and the at least second metal oxide template contacts the first Cu layer and is comprised of an oxide of Al, AlCu, Mg, MgCu, Ti, Cr, Zr, Ta, Hf, or Fe, and has a thickness from about 2 to 15 Angstroms.

* * * * *